United States Patent
Feng (10) Patent No.: US 6,862,439 B2
(45) Date of Patent: Mar. 1, 2005

(54) OFFSET COMPENSATION IN A DIRECT-CONVERSION RECEIVER

(75) Inventor: Shen Feng, San Diego, CA (US)

(73) Assignee: Nokia Corporation, Irving, TX (US)

( * ) Notice: Subject to any disclaimer, the term of this patent is extended or adjusted under 35 U.S.C. 154(b) by 424 days.

(21) Appl. No.: 10/185,337

(22) Filed: Jun. 28, 2002

(65) Prior Publication Data

US 2004/0002311 A1 Jan. 1, 2004

(51) Int. Cl.$^7$ ................................................ H04B 1/06
(52) U.S. Cl. ............................... 455/234.1; 455/251.1; 455/324; 455/341; 375/345
(58) Field of Search .................... 455/232.1, 234.1, 455/251.1, 313, 323, 324, 334, 341; 375/319, 345

(56) References Cited

U.S. PATENT DOCUMENTS

| | | | | |
|---|---|---|---|---|
| 5,422,889 A | * | 6/1995 | Sevenhans et al. | 375/319 |
| 6,366,622 B1 | * | 4/2002 | Brown et al. | 375/345 |
| 6,560,448 B1 | * | 5/2003 | Baldwin et al. | 455/234.1 |
| 6,748,200 B1 | * | 6/2004 | Webster et al. | 455/234.1 |
| 6,748,201 B2 | * | 6/2004 | Black et al. | 455/240.1 |
| 6,771,720 B1 | * | 8/2004 | Yang et al. | 375/345 |

* cited by examiner

*Primary Examiner*—Quochien B. Vuong
(74) *Attorney, Agent, or Firm*—Tom Weber; Gary Savitt (57) ABSTRACT

A direct conversion receiver comprises a low noise amplifier, a bandpass filter, a mixer circuit and a baseband processing assembly. The low noise amplifier is capable of receiving communication signals from an antenna and, in turn, the bandpass filter is capable of filtering the received signals to a bandpass including a reception frequency band. The mixer circuit is electrically connected to an output of the bandpass filter, and can demodulate the received signals into differential signals in two channels. The baseband processing assembly is electrically connected to the mixer circuit opposite said bandpass filter. In this regard, the baseband processing assembly can process the demodulated differential signals in at least one of the channels. And to compensate DC offset from the demodulated differential signals, for each channel the baseband processing assembly includes a pair of dynamic offset compensation elements and a static offset compensation element.

20 Claims, 7 Drawing Sheets

OFFSET COMPENSATION IN A DIRECT-CONVERSION RECEIVER

BACKGROUND OF THE INVENTION

The present invention relates to direct conversion receivers and associated bandpass processing assemblies and, more particularly, relates to direct conversion receivers and associated bandpass processing assemblies capable of compensating offsets in the direct conversion receivers and associated bandpass processing assemblies.

The general trend in portable radio communication apparatus is the reduction in volume, weight and power consumption of such devices. This has led to efforts toward reducing the number of elements necessary to perform the functions associated with portable communications devices. In particular, the radio frequency front end of portable devices, which typically comprises a number of down-converting stages, is an area in which a reduction in the number of elements would be beneficial.

One approach to reduce the number of stages in the radio frequency front end is to convert a received radio frequency carrier signal down to a DC intermediate frequency (zero IF) in a single step. This is termed direct conversion and is carried out in receivers known by any one of the terms homodyne or zero IF receivers, as well as direct conversion receivers. In a direct conversion receiver, received radio frequency signals are converted directly into base band signals such that separate intermediate frequency stages are not required. Therefore, the number of higher frequency components needed in a direct conversion receiver is less than in conventional receivers, which include intermediate frequency stages. Due to less complexity, the degree of integration of direct conversion receivers can be increased compared to receivers that must include intermediate frequency stages.

To carry out direct conversion, a local oscillator signal (LO) having the same frequency as the radio frequency carrier signal (i.e., the LO is "on-channel") is mixed with the carrier signal in a suitable non-linear device such as a mixer diode. The output of the mixer contains the sum and difference of the LO and the carrier signal. Thus, a mixer product exists at twice the carrier signal, and also at DC (zero Hz). The high frequency mixer products can be filtered by a suitable low pass filter. Once the radio frequency carrier signal has been down-converted, the modulating signal may be de-modulated using an appropriate demodulator, e.g., an I/Q demodulator for an I/Q modulating signal, or an FM demodulator for an FM signal.

In the field of radio telephony, particularly cellular telephony, use of a direct conversion receiver is not without certain drawbacks. One of the main problems of using a direct conversion receiver in a cellular radiotelephone, and a problem that is widely recognized, is that of DC voltage offset. DC offset basically consists of unwanted DC being provided at the output of the RF front-end stage which, if large enough, causes distortion to the wanted signal. Because DC is encompassed in the IF bandwidth, the DC offset present at the RF front-end output and that contributed by IF amplifiers severely limits the sensitivity of the receiver if it is not removed. Low frequency AC, such as flicker noise and spurious AM demodulation, can also cause similar problems.

The dynamic range of the receiver is adversely affected by the fact that, in addition to the high frequency signal of the reception channel, the mixer of the receiver also receives high frequency signals of channels adjacent to the reception channel. And due to the non-ideality of the mixers, a disturbing DC offset is produced at the output of the mixer. As the strength of the signal of the adjacent channels increases, then, the stronger signals are mixed with the signals of the reception channel. Thus, a stronger signal of the adjacent channels can produce substantially higher DC offset in the signal than the desired signal expressed on the reception channel.

Generally, DC offsets can be divided into two groups: (1) dynamic offsets, and (2) static offsets. Dynamic offsets are typically a function of radio frequency and local oscillator signals in the receiver, as well as undesirable single-tones and gain switching transitions in the receiver. In this regard, dynamic offsets generally change over time. Static offsets, which are independent of the signals and gain switching transitions, can be a function of process variations, such as temperature, supply voltage and DC operation conditions of the elements of the receiver.

A number of different methods to solve the problem caused by DC offset have been investigated. The most common methods include: AC coupling, closed-loop servo correction, and DC averaging and removal.

Of the most common methods, AC coupling is the simplest approach. The IF stages are AC coupled to remove the DC voltage and low frequency noise and stop it from propagating up to the highest gain stages. AC coupling, however, introduces a notch into the center of the IF pass band. In the case of modulation such as FM, the carrier term is removed so distortion is introduced into the required signal. Such distortion is a significant problem with direct conversion: the interference cannot easily be differentiated from the wanted signal. Often a major problem with AC coupling is that the coupling capacitors can take a significant time to charge up which means that the receiver can take tens of milliseconds to settle. In this regard, pre-charging techniques are often required. When a narrow band filter is used, the settling time becomes long because the filter cannot react to quick changes in power. On the other hand, with a wide band filter, it is possible to achieve a short settling time, but a filter of this kind also filters a substantial part of the useful signal, thereby reducing the performance of the receiver.

Of the other most common methods to solve the problem caused by DC offset, closed-loop servo correction has been used in audio amplifiers to remove offset voltages. It can also be used in a direct conversion receiver to remove the DC offset created in cascaded IF stages and the mixers. Careful design, however, is required to ensure stability. Another common method, DC averaging and removal, is usually performed by a digital signal processor (DSP). According to such a solution, the DC count component of the signal is averaged over a relatively long time frame. The average is then subtracted from the wanted signal. DC averaging and removal is broadly equivalent to AC coupling and, as such, can potentially introduce distortion. It does have the advantage over AC coupling, however, in that relatively long average and time (and, hence, very low cut-off frequencies) can be achieved without the need for high impedance design and/or large value coupling capacitors.

Taking the example of an IQ modulated signal, two consecutive symbols are combined into I and Q signals. Thus, I and Q signals are produced from the received signal in the IQ demodulator. And from the produced I and Q signals, a decision is made in the receiver as to which symbol pair (00, 01, 10, 11) has been transmitted. The decision as to whether the transmitted symbol is a 0 or a 1 is made on the basis of the voltage level of the demodulated signal. DC offset can occur in both I and Q signals, which can lead to a wrong decision in the receiver as to the signal pair transmitted. In an extreme case, even the error correction logic of the receiver cannot correct the information that has a faulty expression. In some prior solutions, an attempt is made to express the signal of the reception channel in spite of high interfering DC offset. The drawback of these solutions, however, is the fact that they only operate in situations where the disturbing DC offset is constant or changes very slowly. In situations where the power of the signals in the adjacent channels vary quickly, the disturbing DC offset also changes quickly. As such, the prior solutions are not capable of fully eliminating the disturbance caused by the DC offset. So while the prior solutions are effective in mitigating DC offset in certain circumstances, such solutions do not satisfactorily tackle the problem across a wide range of differing received signal conditions.

SUMMARY OF THE INVENTION

In light of the foregoing background, the present invention provides an improved direct conversion receiver and bandpass processing assembly capable of compensating the received and demodulated differential signals in at leas one channel of the direct conversion receiver for DC offset. Advantageously, the direct conversion receiver and baseband processing assembly of embodiments of the present invention can reduce offsets introduced to received communication signals without degrading performance of the receiver. In addition, the direct conversion receiver and baseband processing assembly of embodiments of the present invention can reduce offsets without suffering from undesirable complexity in design, large die size, current consumption, and process variation. Therefore, the direct conversion receiver and baseband processing assembly of the present invention solve the problems identified by prior techniques and provide additional advantages.

According to one embodiment of the present invention, a direct conversion receiver comprises a low noise amplifier, a bandpass filter, a mixer circuit and a baseband processing assembly. The low noise amplifier is capable of receiving communication signals from an antenna and, in turn, the bandpass filter is capable of filtering the received signals to a bandpass including a reception frequency band. The mixer circuit, which is electrically connected to an output of the bandpass filter, can demodulate the received signals into differential signals in both I and Q channels. The baseband processing assembly is electrically connected to the mixer circuit opposite said bandpass filter. In this regard, the baseband processing assembly can process the demodulated differential signals in both the I and Q channels and compensate the demodulated differential signals for DC offset.

For each channel, the baseband processing assembly includes a baseband amplifier, a variable-gain amplifier, a pair of dynamic offset compensation elements and a static offset compensation element. The baseband amplifier is capable of amplifying the demodulated differential signals, and can comprise an instrumental amplifier including two operational amplifiers. The differential signals can comprise positive signals and negative signals and, as such, one of the operational amplifiers of the baseband amplifier can amplify the demodulated positive signals, while the other operational amplifier can amplify the demodulated negative signals.

The variable-gain amplifier is capable of further amplifying the amplified demodulated differential signals. Similar to the baseband amplifier, the variable-gain amplifier can comprise an instrumental amplifier including two operational amplifiers. As such, one of the operational amplifiers is capable of further amplifying the amplified demodulated positive signals and the other operational amplifier is capable of further amplifying the amplified demodulated negative signals.

The dynamic offset compensation elements each comprise a capacitor, and one dynamic offset compensation element is electrically connected to each of the baseband amplifier and the variable-gain amplifier. In embodiments where the baseband amplifier and/or the variable gain amplifier comprise an instrumental amplifier including two operational amplifiers, one of the dynamic offset compensation elements can be electrically connected between the operational amplifiers of each of the baseband amplifier and/or the variable-gain amplifier. In this regard, the dynamic offset compensation elements are capable of compensating at least a portion of dynamic offset from the demodulated differential signals at the respective amplifier.

The static offset compensation element is electrically connected to the variable-gain amplifier opposite the baseband amplifier. The static offset compensation element is capable of receiving a differential control code representative of static offset. Thereafter, based upon a combination of the differential control code with the further amplified demodulated differential signals from the variable-gain amplifier, the static compensation element is capable of compensating at least a portion of static offset from the further amplified demodulated differential signals.

The static compensation element can comprise two operational amplifiers. In this regard, one of the operational amplifiers can receive the further amplified demodulated positive signals and the other operational amplifier can receive the further amplified demodulated negative signals. In addition, each operational amplifier is capable of receiving signals comprising the combination of a portion of the differential control code and an output of the respective operational amplifier. For example, the operational amplifier receiving the positive signals is also capable of receiving signals comprising the combination of a positive portion of the differential control code and the output of the operational amplifier receiving the positive signals. Similarly, for example, the operational amplifier receiving the negative signals is also capable of receiving signals comprising the combination of a negative portion of the differential control code and the output of the operational amplifier receiving the negative signals.

In addition to the two operational amplifiers, the static compensation element can include a digital-to-analog converter. The digital-to-analog converter can include, for example, a plurality of pairs of switching elements each electrically connected to a current sink capable of drawing a different reference current. In this regard, the differential control code can comprise a plurality of differential control signals such that each pair of switching elements is capable of receiving respective differential control signals. Further, where the static offset compensation element includes two operational amplifiers, each operational amplifier can comprise a switching element electrically connected to each pair of switching elements of the digital-to-analog converter. Thus, one of the switching elements of one of the operational amplifiers is capable of receiving the further amplified demodulated positive signals, and the other switching element of the other operational amplifier is capable of receiving the further amplified demodulated negative signals.

In embodiments including the digital-to-analog converter, the further amplified demodulated differential signals comprise analog signals, and the differential control code comprises a digital control code. The digital-to-analog converter of the static compensation element can therefore receive the digital differential control code and thereafter convert the digital differential control code to an analog differential control code.

Further, the static offset compensation element can also include an analog-to-digital converter capable of receiving the further amplified demodulated differential signals. In this embodiment, the direct conversion receiver is capable of operating in an initialization mode where the direct conversion receiver operates independent of communication signals. In the initialization mode, the analog-to-digital converter is capable of operating to measure an amount of offset at an output of said variable-gain amplifier and thereafter generate the digital control code based upon the measured amount of offset. This digital control code is then used as described above to compensate for DC offset of the variable-gain amplifier.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
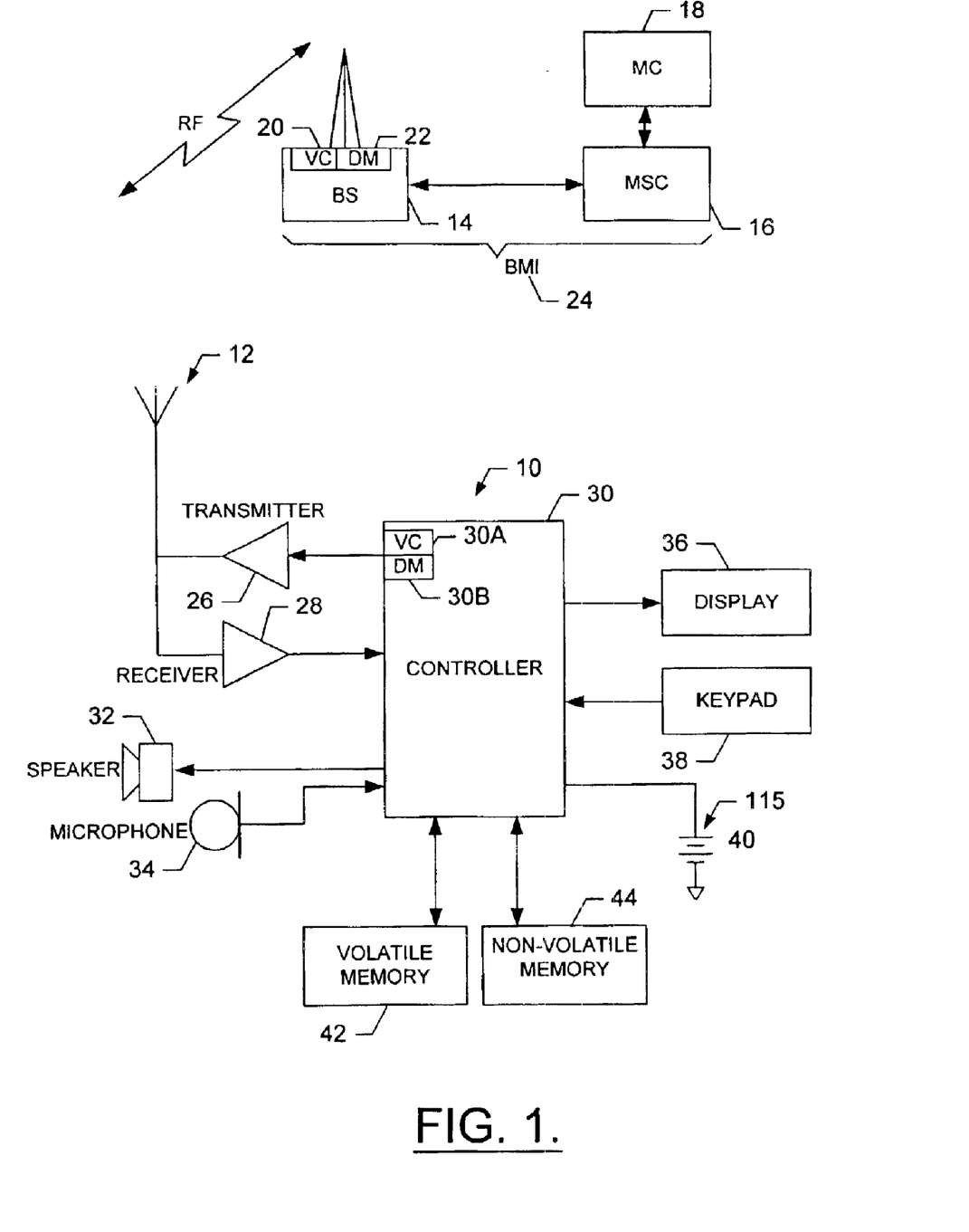
FIG. 1 is a block diagram of a mobile communications system according to one embodiment of the present invention including a mobile station and a Base Station/MSC/Interworking function (BMI) to which the mobile station is bidirectionally coupled through wireless RF links.

Referring to FIG. 1, an illustration of one type of terminal (for example a mobile station, a wireless communication device or a base station) that would benefit from the present invention is provided. It should be understood, however, that the mobile telephone illustrated and hereinafter described is merely illustrative of one type of terminal that would benefit from the present invention and, therefore, should not be taken to limit the scope of the present invention. While several embodiments of the mobile station are illustrated and will be hereinafter described for purposes of example, other types of terminals can readily employ the present invention. Moreover, the system, terminal and method of the present invention will be primarily described in conjunction with wireless mobile communications applications. But the system, terminal and method of the present invention can be utilized in conjunction with a variety of other applications, both in the wireless mobile communications industries and outside of the wireless mobile communications industries.

As described herein, the present invention applies to a mobile station, however, in general, the present invention applies to any terminal, such as any landline telephone, mobile telephone, radiotelephone, pager user terminal, or personal communicator, that is capable of sending a message, and that includes a display for displaying the message to a user. Also, the present invention applies to any terminal, such as any landline telephone, mobile telephone, radiotelephone, pager user terminal, or personal communicator that would benefit from a direct conversion receiver. It should thus be clear that the present invention is not to be construed to be limited to any one particular type of terminal, communication interface standard, or communication protocol other than those that would benefit from a direct conversion receiver.

As shown, the mobile station 10 includes an antenna 12 for transmitting signals to and for receiving signals from a base site or base station (BS) 14. The base station is a part of a cellular network that includes a mobile switching center (MSC) 16, a message center (MC) 18, voice coder/decoders (vocoders) (VC) 20, data modems (DM) 22, and other units required to operate the network. The MSC is capable of routing calls and messages to and from the mobile station when the mobile station is making and receiving calls. As indicated above, the cellular network may also be referred to as a Base Station/MSC/Interworking function (BMI) 24. The MSC controls the forwarding of messages to and from the mobile station when the station is registered with the network, and also controls the forwarding of messages for the mobile station to and from the MC. Such messages may include, for example, voice messages received by the MSC from users of Public Switched Telephone Network (PSTN) telephones (not shown), and may also include Short Message Service (SMS) messages and voice messages received by the MSC from the mobile station or other mobile terminals (not shown) serviced by the network.

The mobile station includes a transmitter 26, a receiver 28, and a controller that provides signals to and receives signals from the transmitter and receiver, respectively. These signals include signaling information in accordance with the air interface standard of the applicable cellular system, and also user speech and/or user generated data. In this regard, the mobile station can be capable of operating with one or more air interface standards, communication protocols, modulation types, and access types. For example, the mobile station may be capable of operating in accordance with wireless communication protocols IS-136, GSM, and IS-95 (CDMA). Some narrow-band AMPS (NAMPS), as well as TACS, mobile terminals may also benefit from the teaching of this invention, as should dual or higher mode phones (e.g., digital/analog or TDMA/CDMA/analog phones).

It is understood that the controller 30 includes the circuitry required for implementing the audio and logic functions of the mobile station. For example, the controller may be comprised of a digital signal processor device, a microprocessor device, and various analog to digital converters, digital to analog converters, and other support circuits. The control and signal processing functions of the mobile station are allocated between these devices according to their respective capabilities. The controller thus also includes the functionality to convolutionally encode and interleave message and data prior to modulation and transmission. The controller can additionally include an internal voice coder (VC) 30A, and may include an internal data modem (DM) 30B.

The mobile station 10 also comprises a user interface, including a conventional earphone or speaker 32, a conventional microphone 34, a display 36, and a user input interface, all of which are coupled to the controller 30. The user input interface, which allows the mobile station to receive data, can comprise any of a number of devices allowing the mobile station to receive data, such as a keypad 38, a touch display (not shown) or other input device. In embodiments including a keypad, the keypad includes the conventional numeric (0–9) and related keys (#, *), and other keys used for operating the mobile station. The mobile station also includes a battery 40, such as a vibrating battery pack, for powering the various circuits that are required to operate the mobile station, as well as optionally providing mechanical vibration as a detectable output, as described below.

To store data upon receipt from the various sources, the mobile station includes volatile memory 42, such as volatile Random Access Memory (RAM) including a cache area for the temporary storage of data. The mobile station can also include non-volatile memory 44, which can be embedded and/or may be removable such as a removable Subscriber Identification Module (SIM). The non-volatile memory can additionally or alternatively comprise an EEPROM, flash memory or the like, such as that available from the SanDisk Corporation of Sunnyvale, Calif., or Lexar Media Inc. of Fremont, Calif. The memories can store any of a number of pieces of information, and data, used by the mobile station to implement the functions of the mobile station. For example, the memories, and particularly the non-volatile memory, can include a directory of names and associated location identifiers, such as mobile telephone numbers, landline telephone numbers, SMS numbers, pager numbers, facsimile numbers, and/or electronic mail (E-mail) addresses that may be entered into memory and thereafter accessed by the user. The memories can also include software routines that control the operation of all or a portion of the controller 30 to thereby implement the present invention. The controller, which can include embedded cache memory, generates appropriate commands and controls the other component blocks of the mobile station.

Figure 2:
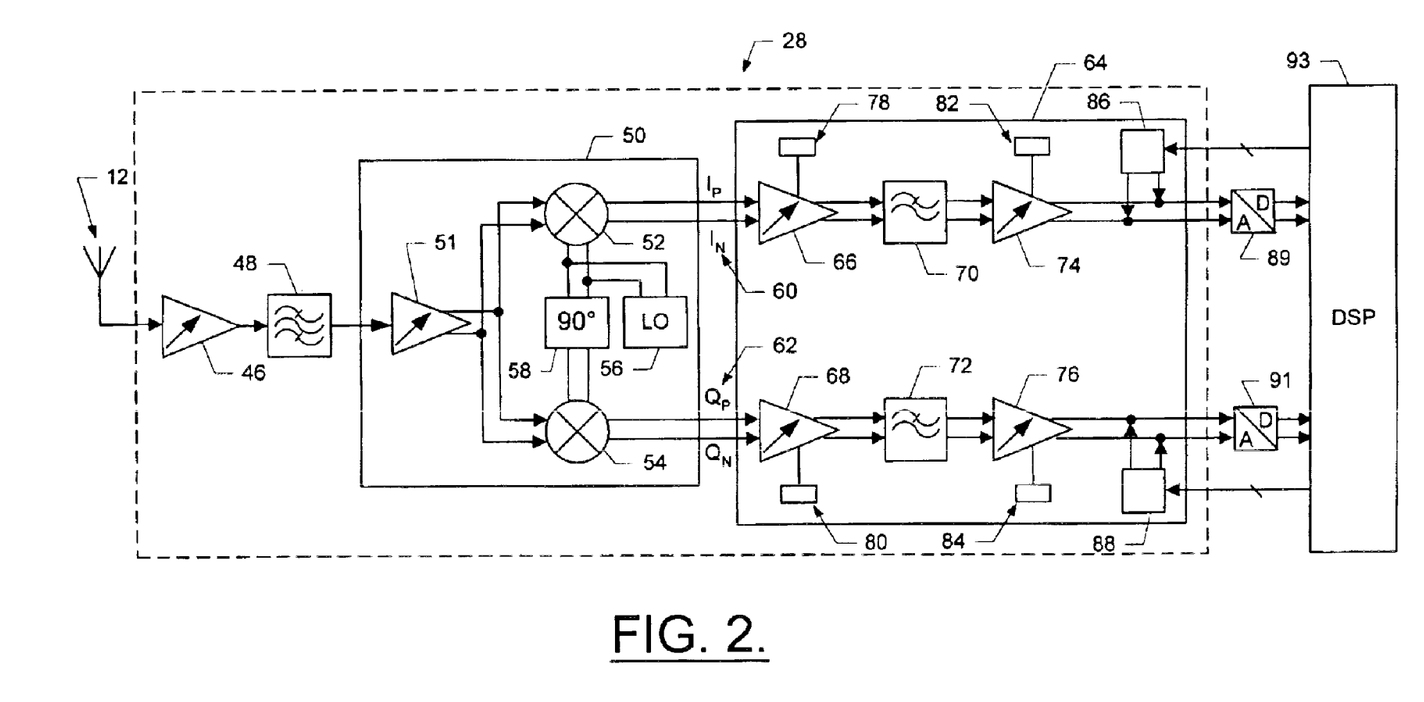
FIG. 2 is a block diagram of a direct conversion receiver according to one embodiment of the present invention.

Referring now to FIG. 2, a block diagram of one embodiment of the receiver 28 of the mobile station 10 is shown. Although the receiver can have any of a number of different designs, the embodiment of the receiver illustrated comprises a direct conversion receiver, which includes a low noise amplifier (LNA) 46 that receives input signals from the antenna 12. The output of the LNA is connected to a bandpass filter 48, the bandpass of which comprises a reception frequency band of the radio communication system in which the receiver is intended to be used. In a GSM system, for example, the reception frequency band is 925 to 960 MHz, which is divided into channels of 200 kHz. In the PCN system, the reception frequency band is 1805 to 1880 MHz, divided into channels of 200 kHz. From the output of the bandpass filter, the filtered signal is directed to a mixer circuit 50, which comprises a buffer amplifier 51, first and second mixers 52, 54, a local oscillator (LO) 56 and a 90° phase shifter 58.

The output of the bandpass filter 48 is connected the buffer amplifier 51, which converts the filtered signal into a differential signal. The differential outputs from the buffer amplifier are, in turn, connected to respective first inputs of the first and second mixers 52, 54. The output signal from the LO 56 is connected to a second input of the first mixer and, via the 90° phase shifter 58, to a second input of the second mixer. The filtered signal comprises a modulated carrier signal, and the mixers use a well-known technique of multiplying the filtered signal with a signal from the LO, where the signal from the LO has the same frequency as the carrier signal. The resulting outputs 60, 62 of the mixer circuit comprise first differential signals referred to as the in-phase channel I and designated as positive signals $I_P$ and negative signals $I_N$, and second differential signals referred to as the quadrature channel Q and designated as positive signals $Q_P$ and negative signals $Q_N$. The respective outputs 60, 62 of the mixer circuit 50 are connected to a baseband processing assembly 64.

Although the baseband processing assembly 64 of the direct conversion receiver 28 can have any of a number of different designs, the baseband processing assembly illustrated includes respective baseband amplifiers 66 and 68, low pass filters 70 and 72, and baseband variable-gain amplifiers (VGA's) 74 and 76. The I channel and Q channel signals (i.e., demodulated differential signals) are amplified by the baseband amplifiers. The amplified I channel and Q channel signals (i.e., amplified demodulated differential signals) are then passed through the respective low pass filters where the undesirable high frequency components of the signals are removed. Following removal of the high frequency components, the amplified I channel and Q channel signals are further amplified to a predetermined amplitude by means of the respective VGA's. The analog signal outputs from the VGA's then pass through analog-to-digital (A/D) converters 89 and 91, which convert the analog signals into digital form for processing by a digital signal processor (DSP) 93.

As described above, direct conversion receivers typically suffer from a form of DC offset, including dynamic offsets and static offsets. In this regard, as the mixer circuit 50 and baseband amplifiers 66 and 68 can suffer from dynamic offsets, the baseband processing assembly 64 of the present invention provides dynamic offset compensation elements 78 and 80 electrically connected to each baseband amplifier. Also, as the overall baseband processing assembly 64 can suffer from dynamic offsets, particularly from the baseband VGA's 74 and 76, the present invention also provides dynamic offset compensation elements 82 and 84 electrically connected to each baseband VGA. And because the overall direct conversion receiver 28 suffers from static offsets, the present invention provides static offset compensation elements 86 and 88 electrically connected at the outputs of the baseband processing assembly. It will be noted that, although the present invention preferably includes the dynamic offset compensation elements and the static compensation elements, the direct conversion receiver can operate without one or more of the dynamic offset compensation elements and/or the static offset compensation elements without departing from the spirit and scope of the present invention.

To more fully describe the dynamic offset compensation elements 78–84, as well as the static compensation elements 86 and 88, reference will now be drawn to FIGS. 3, 5, 6 and 7 which illustrate exemplar circuit diagrams of the baseband amplifier 68 and baseband VGA 74. It will be appreciated that, according to the present invention, the baseband amplifiers and baseband VGA's for the I channel and Q channel have the same configuration. As such, even though FIGS. 3, 5, 6 and 7 illustrate exemplar circuit diagrams of the baseband amplifier and baseband VGA for the I channel, it will be appreciated that the illustrations and description equally apply to the Q channel without departing from the spirit and scope of the present invention.

Figure 3:
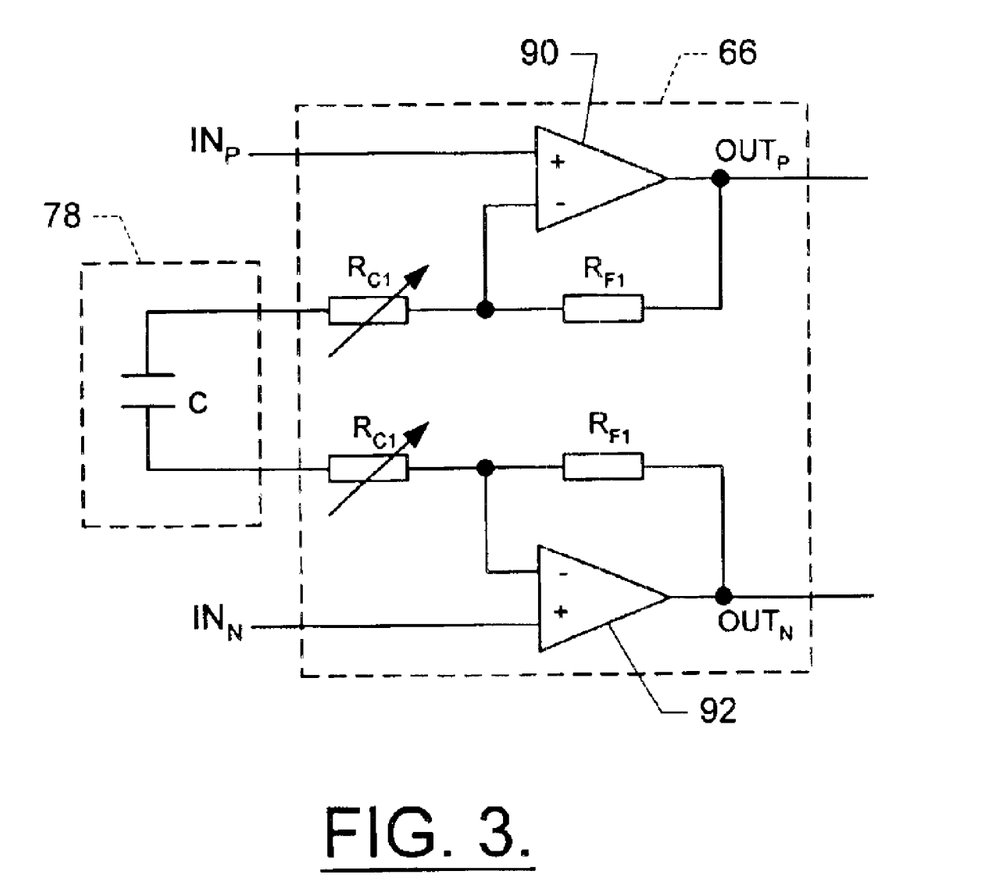
FIG. 3 is a schematic circuit diagram of a baseband amplifier and dynamic offset compensation element according to one embodiment of the present invention.

Referring to FIG. 3, the baseband amplifier 68 of the I channel comprises an instrumental amplifier including two operational amplifiers 90 and 92, with each operational amplifier including feedback resistors $R_{C1}$ and $R_{F1}$, respectively, with feedback resistors $R_{C1}$ comprising variable resistors. The voltage gain of the instrumental amplifier is given by $G=1+R_{F1}/R_{C1}$ and, the voltage gain of the baseband amplifier provided by the instrumental amplifier can comprise any of a number of different values, such as 15 dB when the direct conversion receiver 28 operates in high gain mode. The resistor $R_{F1}$ can have any one of a number of different values, and the resistor $R_{C1}$ can have any one of a number of different value ranges, such that the baseband amplifier has a desired gain range for overall gain variation compensation of the direct conversion receiver. The selection of the resistors, however, is generally a trade off among several performance parameters of the baseband amplifier, such as voltage gain, gain accuracy, noise figure, linearity, current consumption and die size, as will be understood by those skilled in the art. For example, in one embodiment, the feedback resistor $R_{F1}$ can have a value $R_{F1}=250\ \Omega$, with the feedback resistor $R_{C1}$ selected to achieve the desired gain of the baseband amplifier. It will be appreciated that, by constructing the baseband amplifier as an instrumental amplifier, the baseband amplifier can operate with a high input impedance, low noise voltage and broad bandwidth. For example, the baseband amplifier can operate with an input impedance of 10 to 100 k$\Omega$ and a bandwidth of 1 to 10 MHz, depending upon the desired application.

Figure 4:
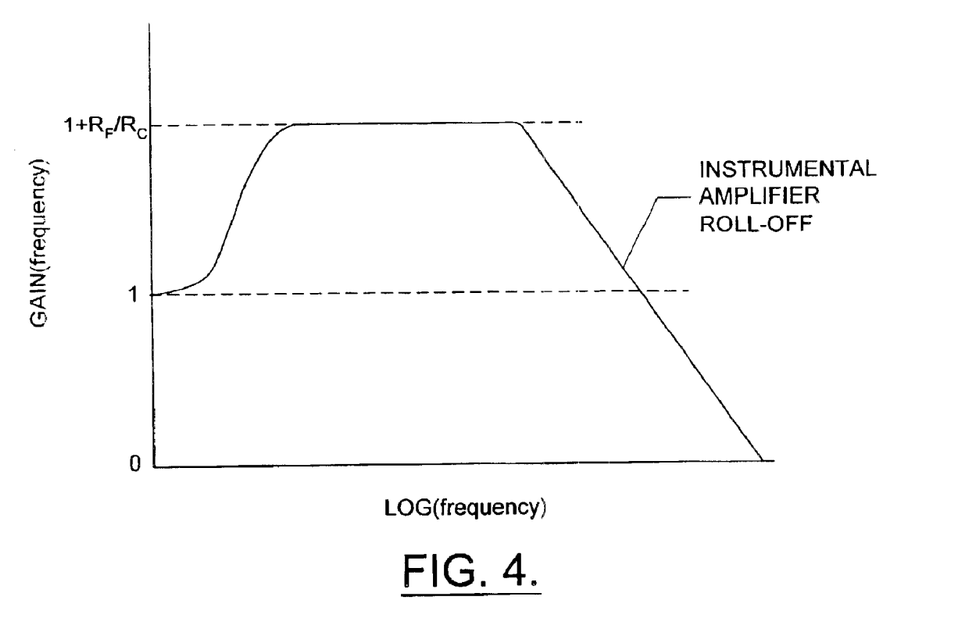
FIG. 4 is a graph illustrating the frequency characteristic of the baseband amplifier with the dynamic compensation element according to one embodiment of the present invention.

The dynamic compensation element 78 is electrically connected to the baseband amplifier 68 and preferably comprises a capacitor C electrically connected between the operational amplifiers 90, 92 and, more particularly, the variable resistors $R_{C1}$. The capacitor presents high impedance at DC (i.e., 0 Hz) and at low frequencies. Therefore, the dynamic and static offsets at the inputs (designated $IN_P$ and $IN_N$) will not be amplified by the baseband amplifier. The capacitor can have any one of a number of different values, but the value of the capacitor is preferably selected to have a low corner frequency. For example, according to one embodiment, the capacitor has a value of 150 nF. As such, the desired signals can pass through the instrumental amplifier with the desired voltage gain, while DC signals or signals having low frequencies are only amplified slightly, if at all. FIG. 4 illustrates the frequency characteristic of the baseband amplifier with the dynamic compensation element.

Figure 5:
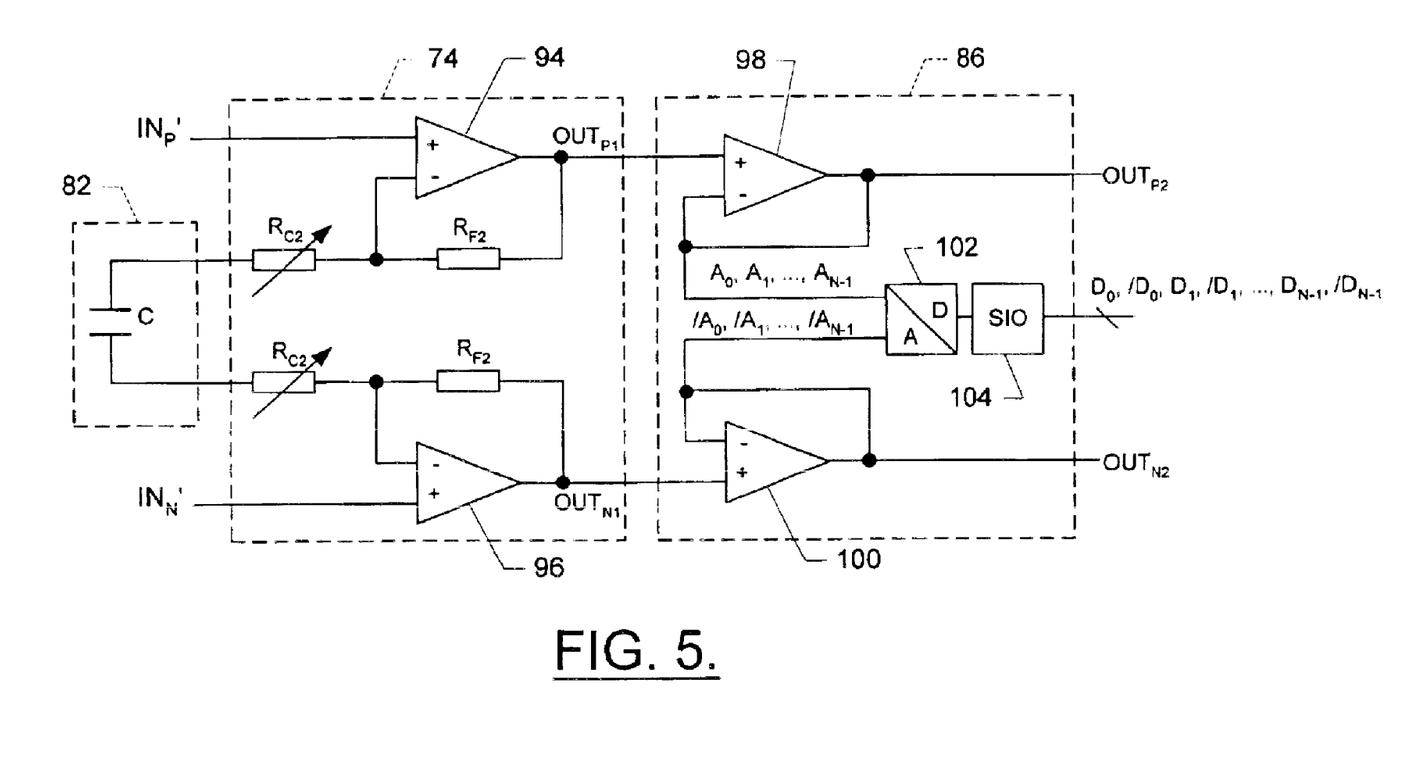
FIG. 5 is a schematic circuit diagram of a variable-gain amplifier and static offset compensation element according to one embodiment of the present invention.

Reference is now drawn to FIG. 5, which illustrates an example circuit diagram of the baseband VGA 74 including the dynamic offset compensation element 82 electrically connected to the baseband VGA, as well as the static offset compensation element 86 electrically connected at the output of the baseband VGA. As indicated above, it will be noted that, although the baseband VGA preferably includes the dynamic offset compensation element and the static compensation element, the baseband VGA can operate without the dynamic offset compensation element or the static offset compensation element without departing from the spirit and scope of the present invention. As shown, the baseband VGA also includes an instrumental amplifier including two operational amplifiers 94 and 96, each of which receives an input from the low pass filter 70 (designated $IN_P'$ and $IN_N'$). Each operational amplifier includes feedback resistors $R_{C2}$ and $R_{F2}$, where feedback resistors $R_{C2}$ again comprise variable resistors. As before, the voltage gain of the instrumental amplifier is given by $G=1+R_{F2}/R_{C2}$. And also as before, the resistor $R_{F2}$ can have any one of a number of different values, and the resistor $R_{C2}$ can have any one of a number of different value ranges, such that the baseband amplifier has a desired gain range for overall gain variation compensation of the direct conversion receiver 28.

Whereas the baseband VGA 74 can have any of a number of different voltage gains depending upon the gain of the instrumental amplifier, in one embodiment the voltage gain of the baseband VGA is 60 dB when the direct conversion receiver 28 operates in high gain mode. The resistor $R_{F2}$ can have any one of a number of different values, and the resistor $R_{C2}$ can have any one of a number of different value ranges, such that the baseband VGA has a desired gain range for overall gain variation compensation of the direct conversion receiver 28. Like with the baseband amplifier 68, the selection of the resistors of the baseband VGA is generally a trade off among several performance parameters of the baseband VGA, as will be understood by those skilled in the art. In one embodiment, for example, the feedback resistor $R_{F2}$ can have a value $R_{F2}=250\ \Omega$, with the feedback resistor $R_{C2}$ selected to achieve the desired gain of the baseband VGA.

At the outputs of the instrumental amplifier (designated $OUT_{P1}$ and $OUT_{N1}$), the baseband VGA 74 is electrically connected to the static offset compensation element 86. In this regard, the static compensation element is provided because additional static compensation can be required if the A/D converter 89 at the output of the baseband VGA cannot process the analog signals including the remaining offsets because of a limited overhead margin of the A/D converter. According to one embodiment, the static compensation element includes operational amplifiers 98 and 100, with each output of the instrumental amplifier electrically connected to one of the inputs of a respective operational amplifier. The output of each operational amplifier is fed back into the other input of the respective amplifier. In addition, differential control signals (designated $D_0$, /$D_0$, $D_1$, /$D_1$, ..., $D_{N-1}$, /$D_{N-1}$ and discussed below), are combined with the outputs of the operational amplifiers and also fed into the other input of the operational amplifiers.

The control signals are fed into the respective inputs of the operational amplifiers 98, 100 after being converted into analog signals by a digital-to-analog (D/A) converter 102. The digital signals are preferably fed to the D/A converter via a serial-in/parallel-out register (SIO) 104 that interfaces with a digital baseband circuit, such as the DSP 93. In this regard, the D/A converter can receive the differential control signals such that a positive portion (i.e., $D_0$, $D_1$, ..., $D_{N-1}$) of the control signals is converted into positive analog control signals (designated $A_0$, $A_1$, ... $A_{N-1}$) and fed into the input of the operational amplifier receiving the positive output (i.e., $OUT_{P1}$) of the baseband VGA 74. Similarly, the D/A converter can convert a negative portion (i.e., /$D_0$, /$D_1$, ..., /$D_{N-1}$) of the control signals into negative analog control signals (designated /$A_0$, /$A_1$, ... /$A_{N-1}$) and feed the negative analog signals into the input of the operational amplifier receiving the negative output (i.e., $OUT_{N1}$) of the baseband VGA.

The resolution of the D/A converter 102 can be selected to have any one of a number of different values depending upon the requirements of the direct conversion receiver 28 for minimum offsets. In this regard, as the allowable the minimum offsets of the direct conversion receiver decrease, the resolution of the D/A converter typically increases. In this regard, the number of control signals N equals the number of bits of the D/A converter, with the resolution being proportional to the number of bits. In one embodiment, for example, the D/A converter includes between 6 and 9 bits. Collectively, then, the control signals make-up a differential N-bit digital control code that represents an amount of static offset compensation to apply to the direct conversion receiver 28. In the N bit control code, Do represents the least significant bit, while $D_{N-1}$ represents the most significant bit. To see how the control code can be constructed for an amount of static offset compensation, presume the system is designed for a maximum static offset compensation $+/-V_{MAX}$. Each differential control code, then, represents an offset compensation determined according to the following:

$$D_i = \frac{V_{MAX}}{2^{(N-1)-i}}, \qquad (1)$$

where i=1, 2, ... N−1.

Consider, for example, a system designed for a differential eight bit (N=8) control code and a maximum static offset compensation of $+/-V_{MAX}=500$ mV. In such a system, the least significant bit Do represents a static offset compensation of 3.90625 mV. Thus, to compensate for a static offset of 3.90625 mV, the differential eight bit control code could be represented as 10,01,01,01,01,01,01,01. Similarly, to compensate for a static offset of the maximum of +/−500 mV, the differential eight bit control code could be represented as 01,01,01,01,01,01,01,10 (i.e., $D_{N-1}$ representing the static offset compensation of 500 mV).

The control code can be determined by the DSP 93 according to any one of a number of different methods. For example, according to one embodiment, the DSP measures the DC levels after the A/D converter 89 at the output of the direct conversion receiver 28. The DSP can then generate a digital control code of control signals that represent an amount of compensation equaling to the offsets measured. The control code is then fed into the respective inputs of the operational amplifiers. Because the DC voltage levels can be shifted between the two outputs (designated $OUT_{P2}$ and $OUT_{N2}$) depending upon the control signals, the static offsets can be compensated out.

Figure 6:
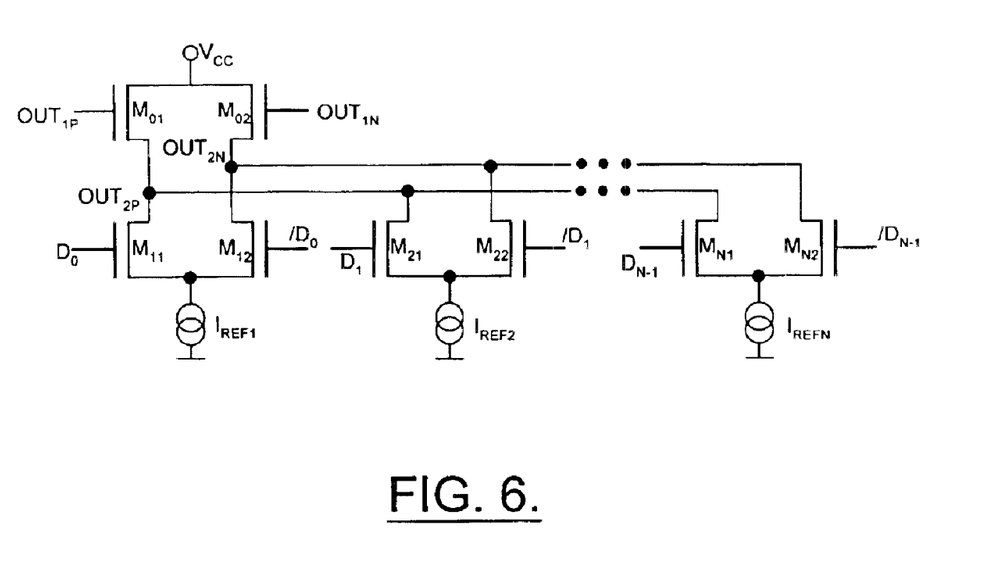
FIG. 6 is a schematic circuit diagram of the static offset compensation element according to one embodiment of the present invention.

Referring now to FIG. 6, an example circuit diagram of the baseband VGA 74 and static compensation element 86 is shown. As shown, the operational amplifiers are unit-gain buffer amplifiers comprising switching elements, such as MOSFET source followers (designated $M_{O1}$ and $M_{O2}$). The current sinks of the MOSFET source followers can be switched to different values based upon different reference currents (designated $I_{REF1}, I_{REF2}, \ldots, I_{REFN}$). The current sinks can be switched through N pairs of differential switching elements, such as MOSFET's (designated $M_{11}/M_{12}, M_{21}/M_{22}, \ldots, M_{N1}/M_{N2}$) based upon the values of the control signals of the control code ($D_0, /D_0, D_1, /D_1, \ldots, D_{N-1}, /D_{N-1}$). In this regard, the value of each reference current can be determined according to the following relationship:

$$I_{REFi} = I_{LSB} \times 2^{(i-1)} \qquad (2)$$

In equation (2), i=1, 2, ... N and $I_{LSB}$ represents the reference current associated with the least significant bit $D_0$ of the control code. The value of $I_{LSB}$, which typically varies between 1 to 10 μA, typically depends upon the voltage represented by $D_0$, as well as the size of the switching elements and the input voltage to the switching elements (designated $V_{cc}$).

It will be appreciated that the use of the differential switching elements ($M_{11}/M_{12}, M_{21}/M_{22}, \ldots, MN_{N1}/M_{N2}$) operates similar to a current-steering D/A converter. In this regard, the number of pairs of switching elements N, and therefore the number of reference currents ($I_{REF1}, I_{REF2}, \ldots, I_{REFN}$), can be considered to represent the resolution of the D/A converter 102. For example, from the example above, the circuit typically includes between 6 and 9 (i.e., N=6, 7, 8 or 9) pairs of differential switching elements and, thus, 6 to 9 different reference currents.

Figure 7:
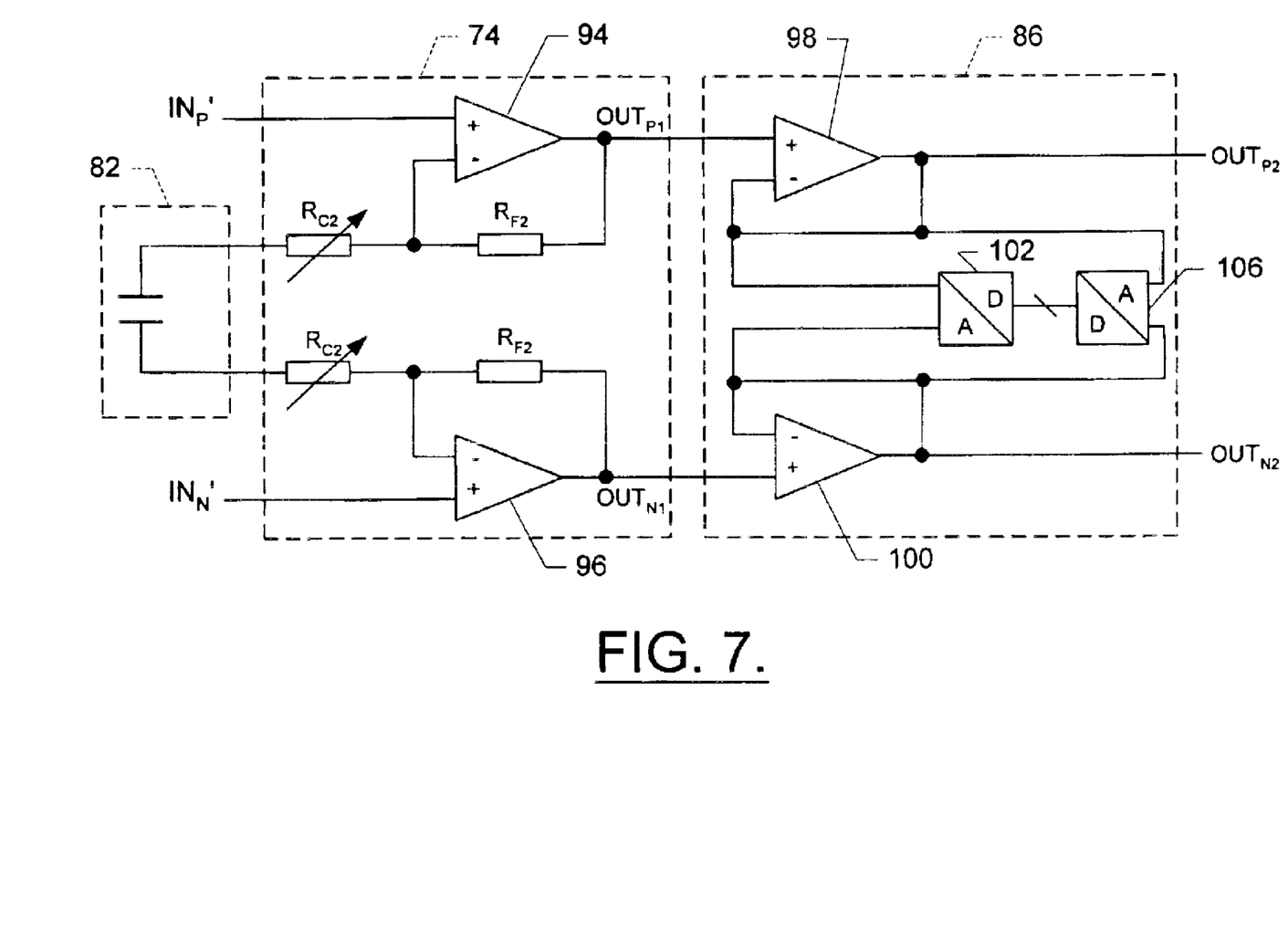
FIG. 7 is a schematic circuit diagram of a variable-gain amplifier and static offset compensation element according to another embodiment of the present invention.

In another embodiment of the present invention, illustrated in FIG. 7, the static offset compensation element 86 includes an A/D converter 106. The resolutions of the A/D converter and D/A converter can be selected to have any one of a number of different values depending upon the requirements of the direct conversion receiver 28 for minimum offsets. And as stated above, as the allowable the minimum offsets of the direct conversion receiver decrease, the resolution of the D/A converter, as well as the resolution of the A/D converter, typically increases. In this regard, as indicated above, the A/D converters and D/A converters typically have a resolution between 6 and 9 bits, with the number of bits being proportional to the resolution of the respective converter. Also, the A/D converter can operate according to any one of a number of different system clocks. For example, the A/D converter can operate according to a clock operating at 13 MHz or 19.2 MHz, for example.

According to this embodiment, the direct conversion receiver 28 is initially operated in an initialization mode where the entire direct conversion receiver, except the LNA 46, is operational. In this regard, the LNA is rendered inoperable because the LNA does not introduce DC offset since the LNA is AC-coupled to the bandpass filter 48. In the initialization mode, the receiver does not receive input signals from the antenna 12 and, as such, the only analog signals processed by the direct conversion receiver are the analog DC offsets. As the DC offsets are processed, the A/D converter 106 measures the output offsets for a predefined time period, typically for a time period between several tens of microseconds to several microseconds. After the predefined time period, the analog output offsets that were measured by the A/D converter 106 are converted by the A/D converter to the digital differential control code comprising the differential control signals ($D_0, /D_0, D_1, /D_1, \ldots, D_{N-1}, /D_{N-1}$), which are fed into the D/A converter 102. The direct conversion receiver is then operated in a normal mode where all components are operational, and the A/D converter 106 is switched off. The differential control signals are kept in a register in the D/A converter 102, and the operation of the direct conversion receiver then proceeds as before.

The direct conversion receiver and baseband processing assembly of the present invention, are therefore capable of compensating DC offset from received and demodulated differential signals in both an I and Q channels in the direct conversion receiver. The direct conversion receiver and baseband processing assembly of embodiments of the present invention can reduce offsets without suffering from undesirable complexity in design, large die size, current consumption, and process variation. In addition, the direct conversion receiver and baseband processing assembly of embodiments of the present invention can advantageously reduce offsets without suffering from degradation in performance of the receiver. By compensating for the DC offsets, the direct conversion receiver and baseband processing assembly of the present invention are capable of processing received signals such that the processed signals more accurately represent the desired signals.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A baseband processing assembly capable of compensating received and demodulated differential signals in at least one channel of a direct conversion receiver for DC offset, wherein, for each of the at least one channel, said baseband processing assembly comprises:
   a baseband amplifier capable of amplifying the demodulated differential signals;
   a variable-gain amplifier capable of receiving and further amplifying the amplified demodulated differential signals from said baseband amplifier;
   a pair of dynamic offset compensation elements each comprising a capacitor, wherein one dynamic offset compensation element is electrically connected to said baseband amplifier and the other dynamic offset compensation element is electrically connected to said variable-gain amplifier, wherein said dynamic offset compensation elements are capable of compensating at least a portion of dynamic offset from the demodulated differential signals at the respective amplifier; and
   a static offset compensation element electrically connected to said variable-gain amplifier opposite said baseband amplifier, wherein said static offset compensation element is capable of receiving a differential control code representative of static offset and thereafter compensating at least a portion of static offset from the further amplified demodulated differential signals based upon a combination of the differential control code with the further amplified demodulated differential signals from the variable-gain amplifier.

2. A baseband processing assembly according to claim 1, wherein the differential signals comprise positive signals and negative signals, wherein said baseband amplifier comprises an instrumental amplifier including two operational amplifiers, wherein one of the operational amplifiers is capable of amplifying the demodulated positive signals and the other operational amplifier is capable of amplifying the demodulated negative signals, and wherein one of the dynamic offset compensation elements is electrically connected between the operational amplifiers.

3. A baseband processing assembly according to claim 1, wherein the differential signals comprise positive signals and negative signals, wherein said variable-gain amplifier comprises an instrumental amplifier including two operational amplifiers, wherein one of the operational amplifiers is capable of further amplifying the amplified demodulated positive signals and the other operational amplifier is capable of further amplifying the amplified demodulated negative signals, and wherein one of the dynamic offset compensation elements is electrically connected between the operational amplifiers.

4. A baseband processing assembly according to claim 1, wherein the differential signals comprise positive signals and negative signals, wherein said static offset compensation element comprises two operational amplifiers, wherein one of the operational amplifiers is capable of receiving the further amplified demodulated positive signals and the other operational amplifier is capable of receiving the further amplified demodulated negative signals, and wherein each operational amplifier is also capable of receiving signals comprising a combination of a portion of the differential control code and an output of the respective operational amplifier.

5. A baseband processing assembly according to claim 4, wherein the operational amplifier receiving the positive signals is also capable of receiving signals comprising the combination of a positive portion of the differential control code and the output of the operational amplifier receiving the positive signals, and wherein the operational amplifier receiving the negative signals is also capable of receiving signals comprising the combination of a negative portion of the differential control code and the output of the operational amplifier receiving the negative signals.

6. A baseband processing assembly according to claim 4, wherein the further amplified demodulated differential signals comprise analog signals, wherein the differential control code comprises a digital control code, and wherein said static compensation element further comprises a digital-to-analog converter capable of receiving the digital differential control code and thereafter converting the digital differential control code to an analog differential control code.

7. A baseband processing assembly according to claim 6, wherein said static offset compensation element further comprises an analog-to-digital converter capable of receiving the further amplified demodulated differential signals, wherein the direct conversion receiver is capable of operating in an initialization mode where the direct conversion receiver operates independent of communication signals, and wherein said analog-to-digital converter is capable of operating in the initialization mode to measure an amount of offset at an output of said variable-gain amplifier and thereafter generate the digital control code based upon the measured amount of offset.

8. A baseband processing assembly according to claim 6, wherein the differential control code comprises a plurality of differential control signals, wherein said digital-to-analog converter comprises a plurality of pairs of switching elements electrically connected to a current sink capable of drawing a different reference current, and wherein each pair of switching elements is capable of receiving respective differential control signals.

9. A baseband processing assembly according to claim 8, wherein the differential signals comprise positive signals and negative signals, wherein said static offset compensation element includes two operational amplifiers each comprising a switching element electrically connected to each pair of switching elements of the digital-to-analog converter, and wherein one of the switching elements of one of the operational amplifiers is capable of receiving the further amplified demodulated positive signals and the other switching element of the other operational amplifier is capable of receiving the further amplified demodulated negative signals.

10. A baseband processing assembly capable of compensating received and demodulated analog differential signals in at least one channel of a direct conversion receiver for DC offset, wherein, for each of the at least one channel, said baseband processing assembly comprises:

a baseband amplifier capable of amplifying the demodulated differential signals;

a variable-gain amplifier capable of receiving and further amplifying the amplified demodulated differential signals from said baseband amplifier;

a pair of dynamic offset compensation elements each comprising a capacitor, wherein one dynamic offset compensation element is electrically connected to said baseband amplifier and the other dynamic offset compensation element is electrically connected to said variable-gain amplifier; and a static offset compensation element electrically connected to said variable-gain amplifier opposite said baseband amplifier, wherein said static offset compensation element comprises:

an analog-to-digital converter electrically connected to an output of said variable-gain amplifier opposite said baseband amplifier, wherein the direct conversion receiver is capable of operating in an initialization mode where the direct conversion receiver operates independent of communication signals and the analog-to-digital converter is capable measuring an amount of offset at the output of said variable-gain amplifier and thereafter generating a digital differential control code based upon the measured amount of offset; and a digital-to-analog converter capable of receiving the digital differential control code and thereafter converting the digital differential control code into an analog differential control code, wherein said static offset compensation element is capable of compensating at least a portion of static offset from the further amplified demodulated differential signals based upon a combination of the analog differential control code with the further amplified demodulated differential signals from the variable-gain amplifier.

11. A baseband processing assembly according to claim 10, wherein the differential signals comprise positive signals and negative signals, wherein said baseband amplifier comprises an instrumental amplifier including two operational amplifiers, wherein one of the operational amplifiers is capable of amplifying the positive demodulated signals and the other operational amplifier is capable of amplifying the negative demodulated signals, and wherein one of the dynamic offset compensation elements is electrically connected between the operational amplifiers.

12. A baseband processing assembly according to claim 10, wherein the differential signals comprise positive signals and negative signals, wherein said variable-gain amplifier comprises an instrumental amplifier including two operational amplifiers, wherein one of the operational amplifiers is capable of further amplifying the positive amplified demodulated signals and the other operational amplifier is capable of amplifying the negative amplified demodulated signals, and wherein one of the dynamic offset compensation elements is electrically connected between the operational amplifiers.

13. A baseband processing assembly according to claim 10, wherein the differential signals comprise positive signals and negative signals, wherein said static offset compensation element further comprises two operational amplifiers, wherein the analog-to-digital converter is electrically connected to an output of each of the operational amplifiers, wherein one of the operational amplifiers is capable of receiving the further amplified demodulated positive signals and the other operational amplifier is capable of receiving the further amplified demodulated negative signals, and wherein each operational amplifier is also capable of receiving signals comprising a combination of a portion of the analog differential control code and an output of the respective operational amplifier.

14. A baseband processing assembly according to claim 13, wherein the operational amplifier receiving the positive signals is also capable of receiving signals comprising the combination of a positive portion of the differential control code and the output of the operational amplifier receiving the positive signals, and wherein the operational amplifier receiving the negative signals is also capable of receiving signals comprising the combination of a negative portion of the differential control code and the output of the operational amplifier receiving the negative signals.

15. A baseband processing assembly according to claim 10, wherein the differential control code comprises a plurality of differential control signals, wherein the digital-to-analog converter comprises a plurality of pairs of switching elements electrically connected to a current sink capable of drawing a difference reference current, and wherein each pair of switching elements is capable of receiving respective differential control signals.

16. A baseband processing assembly according to claim 15, wherein the differential signals comprise positive signals and negative signals, wherein said static offset compensation element includes two operational amplifiers each comprising a switching element electrically connected to each pair of switching elements of the digital-to-analog converter, wherein one of the switching elements of one of the operational amplifiers is capable of receiving the further amplified demodulated positive signals and the other switching element of the other operational amplifier is capable of receiving the further amplified demodulated negative signals.

17. A direct conversion receiver comprising:

a low noise amplifier capable of receiving communication signals from an antenna;

a bandpass filter capable of filtering the received signals to within a reception frequency band;

a mixer circuit electrically connected to an output of said bandpass filter capable of demodulating the received signals into differential signals in two channels; and a baseband processing assembly electrically connected to said mixer circuit opposite said bandpass filter, for each channel said baseband processing assembly comprising:

a baseband amplifier;

a variable-gain amplifier electrically connected to said baseband amplifier opposite said mixer circuit;

a pair of dynamic offset compensation elements each comprising a capacitor, wherein one dynamic offset compensation element is electrically connected to said baseband amplifier and the other dynamic offset compensation element is electrically connected to said variable-gain amplifier; and a static offset compensation element electrically connected to said variable-gain amplifier opposite said baseband amplifier, wherein said static offset compensation element is capable of receiving a differential control code representative of static offset and thereafter combining the differential control code with output differential signals from the variable-gain amplifier.

18. A direct conversion receiver according to claim 17, wherein said static offset compensation element comprises:

an analog-to-digital converter capable of receiving the output differential signals from the variable-gain amplifier, wherein the direct conversion receiver is capable of operating in an initialization mode where the direct conversion receiver operates independent of communication signals from the antenna and the analog-to-digital converter is capable measuring an amount of offset at an output of said variable-gain amplifier and thereafter generating a digital differential control code based upon the measured amount of offset; and a digital-to-analog converter capable of receiving the digital differential control code and thereafter converting the digital differential control code into an analog differential control code, wherein said static offset compensation element is capable of combining the analog differential control code with the further amplified demodulated differential signals from the variable-gain amplifier.

19. A direct conversion receiver according to claim 17 is employed in connection with a mobile station.

20. A direct conversion receiver according to claim 17 is employed in connection with a terminal.

* * * * *